United States Patent
Niu et al.

(10) Patent No.: US 10,753,990 B2
(45) Date of Patent: Aug. 25, 2020

(54) METHOD AND APPARATUS FOR MEASURING MAGNETIC FIELD STRENGTH

(71) Applicant: TAIWAN SEMICONDUCTOR MANUFACTURING CO., LTD., Hsinchu (TW)

(72) Inventors: Baohua Niu, Portland, OR (US); Ji-Feng Ying, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 72 days.

(21) Appl. No.: 15/905,574

(22) Filed: Feb. 26, 2018

(65) Prior Publication Data

US 2019/0146045 A1 May 16, 2019

Related U.S. Application Data

(60) Provisional application No. 62/584,512, filed on Nov. 10, 2017.

(51) Int. Cl.

| | | |
|---|---|---|
| G01R 33/26 | (2006.01) |
| G01R 33/12 | (2006.01) |
| G01Q 60/08 | (2010.01) |
| G01Q 60/52 | (2010.01) |
| G01Q 70/14 | (2010.01) |
| G01Q 30/02 | (2010.01) |
| G01R 33/32 | (2006.01) |
| G01R 33/032 | (2006.01) |
| G01Q 60/38 | (2010.01) |

(52) U.S. Cl.
CPC .......... *G01R 33/26* (2013.01); *G01Q 30/025* (2013.01); *G01Q 60/08* (2013.01); *G01Q 60/52* (2013.01); *G01Q 70/14* (2013.01); *G01R 33/032* (2013.01); *G01R 33/12* (2013.01); *G01R 33/323* (2013.01); *G01Q 60/38* (2013.01)

(58) Field of Classification Search
CPC .... G01R 33/26; G01R 33/032; G01R 33/323; G01R 33/12; G01Q 30/025; G01Q 70/14; G01Q 60/52; G01Q 60/08; G01Q 60/38
See application file for complete search history.

(56) References Cited

U.S. PATENT DOCUMENTS

2006/0071662 A1* 4/2006 Xiang ................ B82Y 35/00
324/316
2015/0253355 A1* 9/2015 Grinolds .............. G01R 33/022
850/40
2016/0077167 A1 3/2016 Heidmann

OTHER PUBLICATIONS

Dobrovitski, V.V., et al., "Quantum Control over Single Spins in Diamond", Annu. Rev. Condens. Matter Phys. 2013. 4:23-50 & Annu. Rev. Phys. Chem. 2014. 65:83-105.

* cited by examiner

*Primary Examiner* — Amy He
(74) *Attorney, Agent, or Firm* — McDermott Will & Emery LLP

(57) ABSTRACT

An apparatus for measuring a magnetic field strength is provided. The apparatus includes a stage on which a sample to be measured is placed, a cantilever having a tip, an optical system having a light source and a light receiver, and a microwave power source. The tip is a diamond tip having a nitrogen vacancy defect. The optical system is configured such that excitation light from the light source is focused at the diamond tip. The cantilever is configured as a coaxial microwave antenna through which microwaves from the microwave power source are supplied to the diamond tip.

19 Claims, 6 Drawing Sheets

METHOD AND APPARATUS FOR MEASURING MAGNETIC FIELD STRENGTH

This application claims priority of U.S. Provisional Application No. 62/584,512 filed on Nov. 10, 2017, the entire contents of which are incorporated herein by reference.

TECHNICAL FIELD

The disclosure relates to a method and an apparatus for measuring a magnetic field strength, and more particularly to a method and an apparatus for measuring a magnetic field strength of magnetic elements with micro- or nano-scale structures, such as a magnetic random access memory (MRAM).

BACKGROUND

A magnetic random access memory (MRAM) utilizing a magnetic tunnel junction (MTJ) is one of the next disruptive technologies for CMOS integrated circuits (ICs) including a memory. The advantages of a MRAM are generally low operation power consumption, fast read and write speed, non-volatile nature and immunity to radiation. In manufacturing MRAM devices, it is important to measure a magnetic field strength of magnetic cells and/or films, and spatial distribution thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, at least one of A, B and C means "A," "B," "C," "A and B," "A and C," "B and C," or "A, B and C," and does not mean that one from A, one from B and one from C, unless otherwise indicated.

In order to develop MRAM devices, it is important to select appropriate magnetic materials, to design MRAM cells and to control the manufacturing process. The ability to measure and map magnetic field absolute strength-orientation, for example at single spin level, and a spatial distribution of domain boundaries with a sub-50 nm resolution and without surface topography complication has been required in the MRAM manufacturing process and device designing. In particular, it is necessary to accurately measure and characterize magnetic field strength and spatial distribution (variations) for material characterization and/or selection, process qualification and quality-reliability assurances.

FIGS. 4A-5C show schematic views of a MRAM cell according to an embodiment of the present disclosure.

Figure 4A:
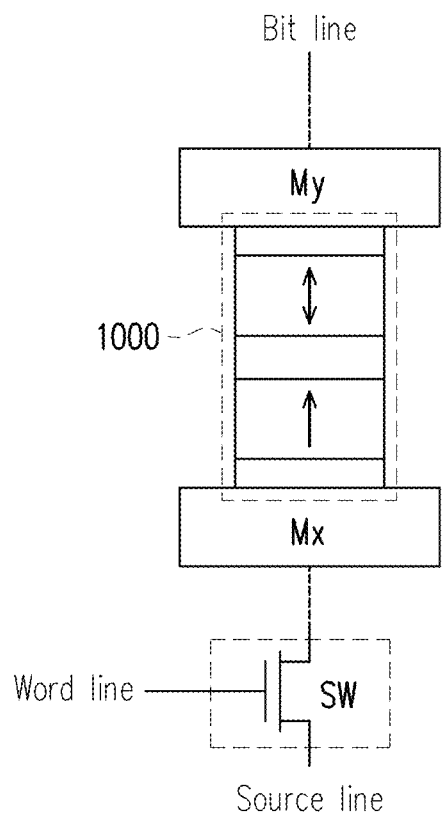
FIG. 4A is a schematic view of a magnetic tunneling junction (MTJ) MRAM cell according to an embodiment of the present disclosure.

FIG. 4A is a schematic view of a MTJ MRAM cell according to an embodiment of the present disclosure. The MTJ film stack 1000 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. One of the terminals of the switching device SW is coupled to the lower metal layer Mx and the other terminal is coupled to the source line, which is a fixed potential (e.g., the ground) in some embodiments. The upper metal layer My is coupled to a bit line. In some embodiments, the switching device SW is disposed between the upper metal layer My and the bit line.

Figure 4B:
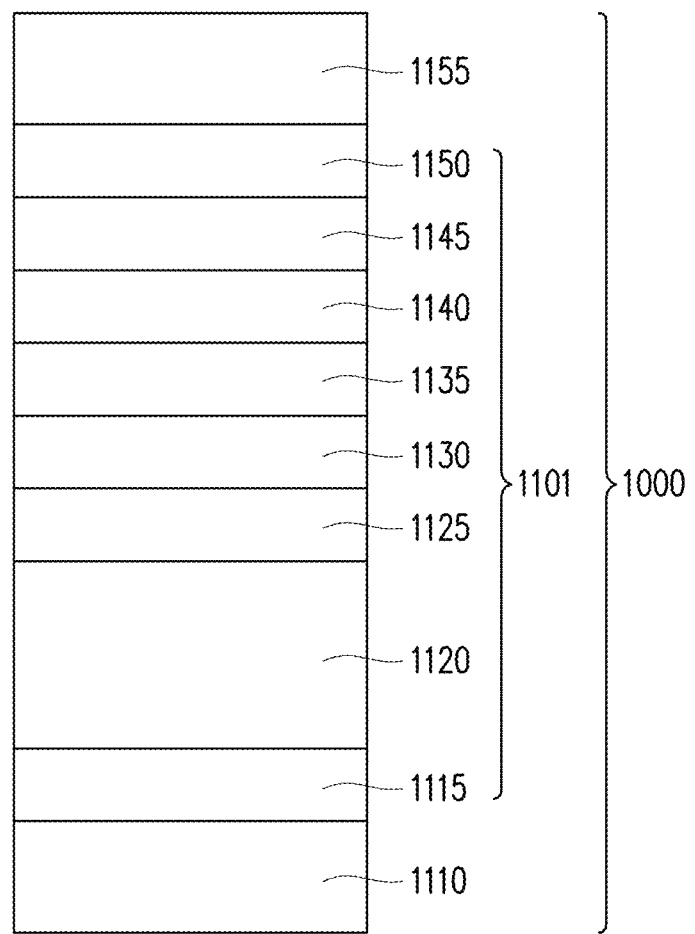
FIG. 4B is a schematic cross sectional view of the MTJ film stack according to an embodiment of the present disclosure.

The MTJ film stack 1000 includes a first electrode layer 1110 coupled to the lower metal layer Mx and a second electrode layer 1155 coupled to the upper metal layer My. An MTJ functional layer 1101 is disposed between the first electrode layer 1110 and the second electrode layer 1155, as shown in FIG. 4B. The MTJ functional layer 1101 includes a second pinned magnetic layer 1130, a free magnetic layer 1140, and a tunneling barrier layer 1135 made of a non-magnetic material and disposed between the second pinned magnetic layer 1130 and the free magnetic layer 1140. The free magnetic layer 1140 and the second pinned magnetic layer 1130 include one or more ferromagnetic materials that can be magnetically oriented, respectively. The free magnetic layer 1140 is configured such that the magnetic orientation can be changed, or rotated, by exposure to an external magnetic field. The second pinned magnetic layer 1130 is configured such that the magnetic orientation is fixed and will not respond to a typical magnetic field.

The tunneling barrier layer 1135 includes a relatively thin oxide layer capable of electrically isolating the free magnetic layer 1140 from the second pinned magnetic layer 1130 at low potentials and capable of conducting current through electron tunneling at higher potentials. In some embodiments, the tunneling barrier layer 1135 is made of magnesium oxide (MgO).

The MTJ functional layer 1101 further includes an antiferromagnetic layer 1125, as shown in FIG. 4B. The antiferromagnetic layer 1125 is used to fix the magnetic orientation of the second pinned magnetic layer 1130. The antiferromagnetic layer 1125 includes ruthenium (Ru) or any other suitable antiferromagnetic material.

The MTJ functional layer 1101 further includes a first pinned magnetic layer 1120 and a second pinned magnetic layer 1130 both including one or more magnetic materials, as shown in FIG. 4B.

Figure 5A:
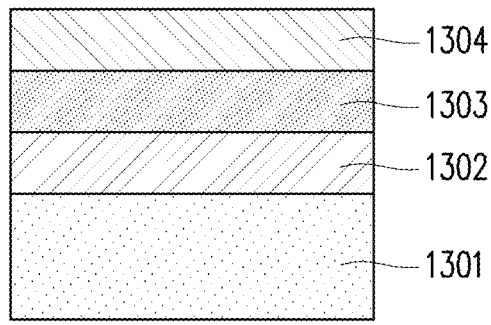
FIGS. 5A, 5B and 5C show schematic cross sectional views of magnetic layers of the MTJ film stack according to an embodiment of the present disclosure.

The second pinned magnetic layer 1130 includes multiple layers of magnetic materials. In some embodiments, as shown in FIG. 5A, the second pinned magnetic layer 1130 includes four layers 1301, 1302, 1303 and 1304, where the layer 1304 is in contact with the tunneling barrier layer 1135 and the layer 1301 is in contact with the antiferromagnetic layer 1125. In some embodiments, the layer 1301 (the bottommost layer) includes a multilayer structure of cobalt (Co) and platinum (Pt). In certain embodiments, the layer 1301 is the cobalt layer and the layer 1302 is the multilayer of the cobalt layers and the platinum layers as set forth above. The layer 1303 is a spacer layer. The layer 1304 is a cobalt iron boron (CoFeB) layer, a cobalt/palladium (CoPd) layer and/or a cobalt iron (CoFe) layer.

Figure 5B:
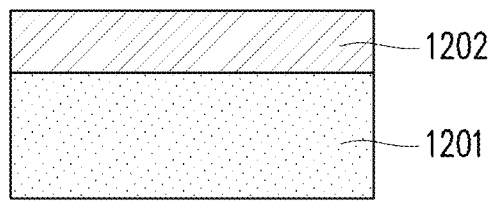

The first pinned magnetic layer 1120 includes multiple layers of magnetic materials. In some embodiments, as shown in FIG. 5B, the first pinned magnetic layer 1120 includes four layers 1201 and 1202, where the layer 1202 is in contact with the antiferromagnetic layer 1125. In some embodiments, the layer 1201 includes a multilayer structure of cobalt (Co) and platinum (Pt).

Figure 5C:
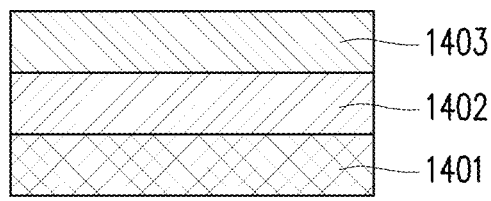

The free magnetic layer 1140 includes a cobalt iron boron (CoFeB) layer, a cobalt/palladium (CoPd) layer and/or a cobalt iron (CoFe) layer in some embodiments. In other embodiments, the free magnetic layer 1140 includes multiple layers of magnetic materials. In some embodiments, as shown in FIG. 5C, the free magnetic layer 1140 includes four layers 1401, 1402 and 1403, where the layer 1401 is in contact with the tunneling barrier layer 1135. The layers 1401 and 1403 are a cobalt iron boron (CoFeB) layer, a cobalt/palladium (CoPd) layer and/or a cobalt iron (CoFe) layer in some embodiments. The layer 1402 is a spacer layer.

The MTJ functional layer 1101 further includes a seed layer 1115 formed on the first electrode layer 1110, a capping layer 1145 formed on the free magnetic layer 1140, a diffusion barrier layer 1150 formed on the capping layer 1145, as shown in FIG. 4B. The capping layer 1145 is made of a dielectric material, such as magnesium oxide or aluminum oxide. The first electrode layer 1110 is made of a conductive material, such as a metal, to reduce the resistance of the first pinned magnetic layer 1120, in particular for programming. The second electrode layer 1155 is also made of a conductive material, such as a metal, to reduce the resistivity during reading.

In the MTJ MRAM cell, various magnetic material layers are used and stacked. As set forth above, one of the key issues to develop a high performance MTJ MRAM device is to precisely evaluate, characterize and analyze the various magnetic material layers, for example, a strength of the magnetic field of each magnetic material layer and its spatial distribution.

One of the magnetic field strength measurement apparatuses is a magnetic resonance force microscopy (MRFM). A magnetic resonance force microscopy is a variant form of an atomic force microscopy (AFM), which uses a magnetized AFM tip. The magnetic resonance force microscopy generally requires two scans: a first scan, in which a cantilever force (based on van der Waals force interaction of the tip with the surface) is scanned to obtain topography information; then a second scan, in which a constant topography following scan at fixed surface to tip distance (e.g. 20 nm) is performed to get the magnetic force measurement. This "lift-up" in the magnetic resonance force microscopy scan is for the purpose of minimizing topographic noise.

Magnetic force between the sample and the tip is very complex and decays with spacing very fast (e.g., $\vec{F} \propto 1/r^4$ for head-to-head magnetic dipoles). In the magnetic resonance force microscopy, a large "lift up" value rapidly diminishes the magnetic signal. Since the "lift up" values are limited, topographic noise is always a significant part of the magnetic resonance force microscopy data. The topographic noise and the complexity of the force-field relationship make the data interpretation complicated, and thus the magnetic resonance force microscopy is not a promising apparatus to measure subtle changes in "pure magnetic field," such as the case in the MRAM development.

Further, it is difficult to control or characterize the shapes of the magnetic resonance force microscopy tip and magnetic strength prior to the measurements. This also makes a consistent tip-to-tip measurement difficult and causes run-to-run data to be incomparable.

In this disclosure, a novel method and apparatus of measuring a magnetic field strength is disclosed. According to an embodiment of the present disclosure, a scanning probe cantilever, which employs a single crystal diamond tip grafted with a single nitrogen vacancy defect (NV) placed at near the apex (e.g., less than about 5 nm) of the tip, is utilized. The diamond tip with the nitrogen vacancy defect can detect the samples' magnetic field strength directly, quantitatively and consistently. The cantilever is shielded by an impedance matched conductor with the cantilever for efficient microwave delivery to the nitrogen vacancy defect. A tunable microwave generator-receiver with an impedance match network is used to supply the microwaves to the tip with a magnetic field analysis capability. The disclosed method employs an optically detected magnetic resonance (ODMR) to detect sample's magnetic field strength ($\vec{B}$ instead of $\vec{F}$), at very high detection sensitivity.

With the disclosed method and apparatus, it is possible to achieve "topography-artifact-free" magnetic imaging (enabled by direct $\vec{B}$ measurement) and an "AFM-class" spatial resolution (e.g., about 10 nm). Further, the combination of a confocal laser scanning microscope (CLSM) and an AFM system (scanning single nitrogen vacancy defect spin probe and scanning sample stage) enables both a large testable area at a die level and a high spatial resolution at a bit (memory cell) level. In addition, the combination of the optically detected magnetic resonance, the confocal laser scanning microscope and a switch current provision apparatus enable a switching behavior analysis under variable switching currents on individual MRAM cells over the entire die. Moreover, the combination of the optically detected magnetic resonance, the confocal laser scanning microscope and a magnetic field generating apparatus (local or flooding) enables a switching behavior analysis under variable switching fields on individual MRAM cells over the entire die.

Further, the optically detected magnetic resonance with a diamond tip including a nitrogen vacancy detect has a high sensitivity at about $nT/\sqrt{Hz}$, which is about 1000 time higher than MRFM. In addition, the capabilities of magnetic impedance measurement can be used to measure materials properties—not purely magnetic in nature—like impurities that can impact the MRAM's performances.

As explained below, direct $\vec{B}$ measurement by the optically detected magnetic resonance is much less sensitive to a distance between the diamond tip and the surface of the sample to be measured. Such a low sensitivity in the distance enables substantially "topography-free" magnetic field strength measurement and spatial distribution imaging. High resolution magnetic resonance and high contrast ratio of the optical detection give a very high magnetic sensitivity and low noise. In addition, since the AFM system (stages, etc.) can be utilized, it is possible to test a large sample area (e.g., the whole die), with high spatial resolution (e.g., 10 nm order) on the region-of-interest.

Figure 1:
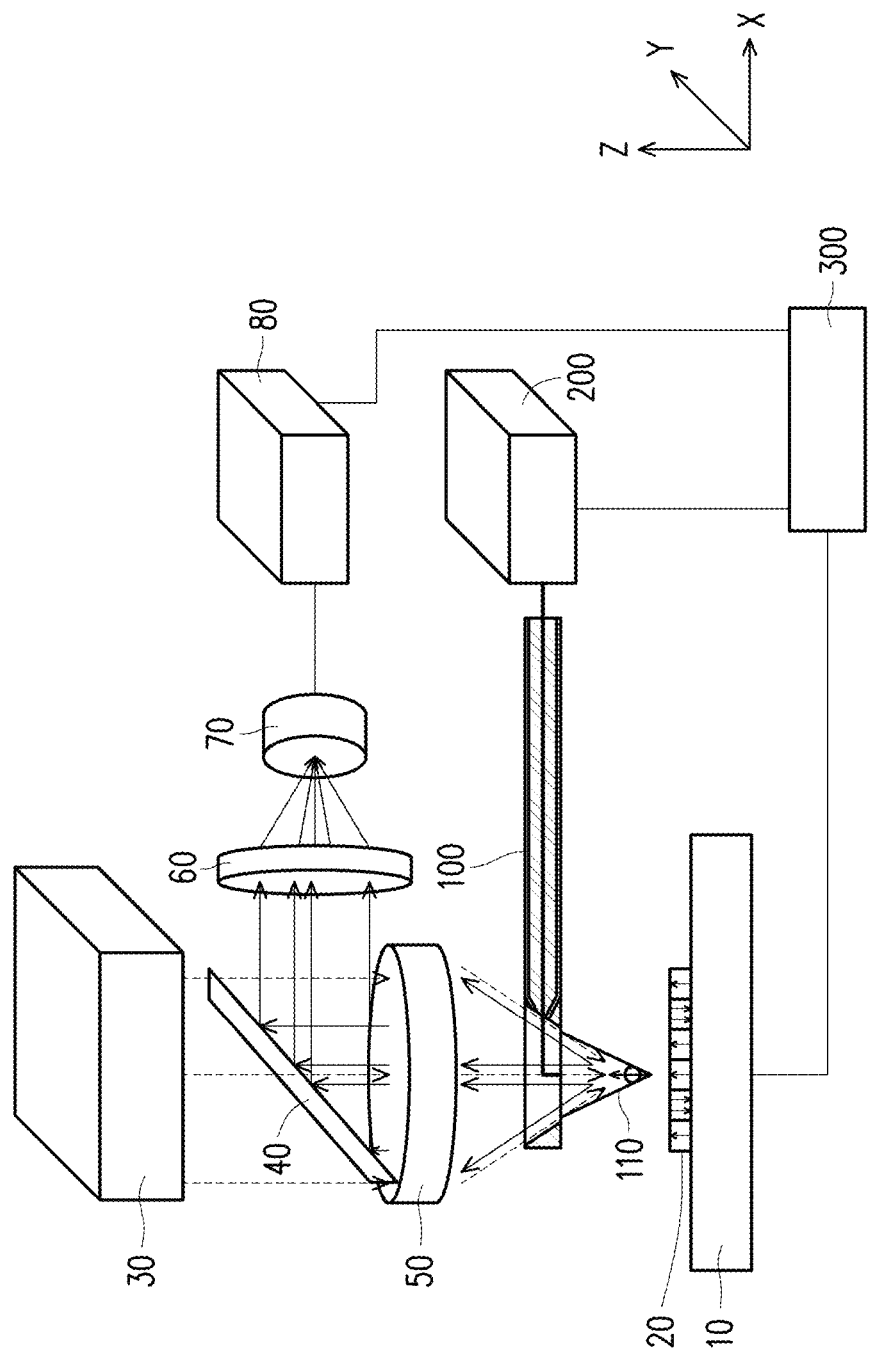
FIG. 1 shows a schematic view of a magnetic field strength measurement apparatus according to an embodiment of the present disclosure.

FIG. 1 shows a schematic view of a magnetic field strength measurement apparatus according to an embodiment of the present disclosure. The major configuration of the apparatus is the same or similar to an atomic force microscope.

The magnetic field strength measurement apparatus includes a stage 10 on which a sample 20 is placed. The stage 10 is an X-Y stage movable along the X direction and the Y direction. Further, the height of the stage 10 can be adjusted in the Z direction. The configuration, mechanism and materials for the stage 10 are substantially the same as a stage used in an AFM system, and thus the details thereof are omitted.

The magnetic field strength measurement apparatus includes further includes a cantilever 100 with a diamond tip 110, as shown in FIG. 1. The detailed configuration of the cantilever will be described later.

The magnetic field strength measurement apparatus includes an optical system. As shown in FIG. 1, the optical system, which may be a confocal optical system, includes an excitation light source 30, a dichroic mirror (a beam splitter) 40, an objective lens 50, a focus lens 60 and an optical detector 70, in some embodiments. The excitation light source 30 includes a laser light source in some embodiments. The laser light source can be a semiconductor laser diode, a gas laser or a solid state laser, in some embodiments. In other embodiments, a light emitting diode (LED) is used. The peak wavelength of the emitted laser beams is in a range from about 460 nm to about 580 nm, in some embodiments. In certain embodiments, the peak wavelength is about 530 nm or about 532 nm. The light source emits the excitation light as a continuous wave (CW) or a pulse wave. In the case of pulses, the pulse width is in a range from about 100 ps to about 2000 ps and the repetition frequency is in a range from about 0.1 MHz to 10 MHz, in some embodiments.

In some embodiments, the excitation light source 30 includes a light source and one or more collimator lenses, which can expand and collimate the light emitted from, for example, a laser light source. In other embodiments, the excitation light source 30 includes a light source and a light scanning mechanism to emit scanned light beams.

The emitted excitation light passes, at least partially, through the dichroic mirror 40 and enters the objective lens 50. The objective lens 50 includes one or more optical lenses to focus the incident light to the tip 110 of the cantilever 100. As explained below, the fluorescent light emitted at the tip 110 is collected and collimated by the objective lens 50, and the collimated light reflects by the dichroic mirror 40. The reflected light at the dichroic mirror enters the focus lens 60, which includes one or more lenses, and then the focused light is detected by the optical detector 70.

The objective lens 50 may have a high numerical aperture (NA), which is equal to or higher than 0.80 and up to 0.95 in some embodiments. In some embodiments, the numerical aperture of the objective lens 50 is in a range from about 0.85 to about 0.90. If an immersion lens is used, the NA can be more than 1.0 (e.g., 1.3). The objective lens 50 focuses the excitation light on the tip 110 of the cantilever 100 at a normal angle of incidence in some embodiments.

The optical detector 70 includes one or more of a photo diode (e.g., a silicon avalanche photo diode) and an image sensor (camera), such as a charge coupled device (CCD) sensor or a CMOS sensor in some embodiments. The optical detector 70 is coupled to an optical detector controller 80 including a computer.

The confocal optical system with an objective lens having high numerical aperture and a long working distance (e.g., about 5 mm to about 15 mm) enables high power density pumping (excitation) of the nitrogen vacancy defect, and a high collection efficiency (e.g., more than about 70%) of the fluorescence light.

Figure 2:
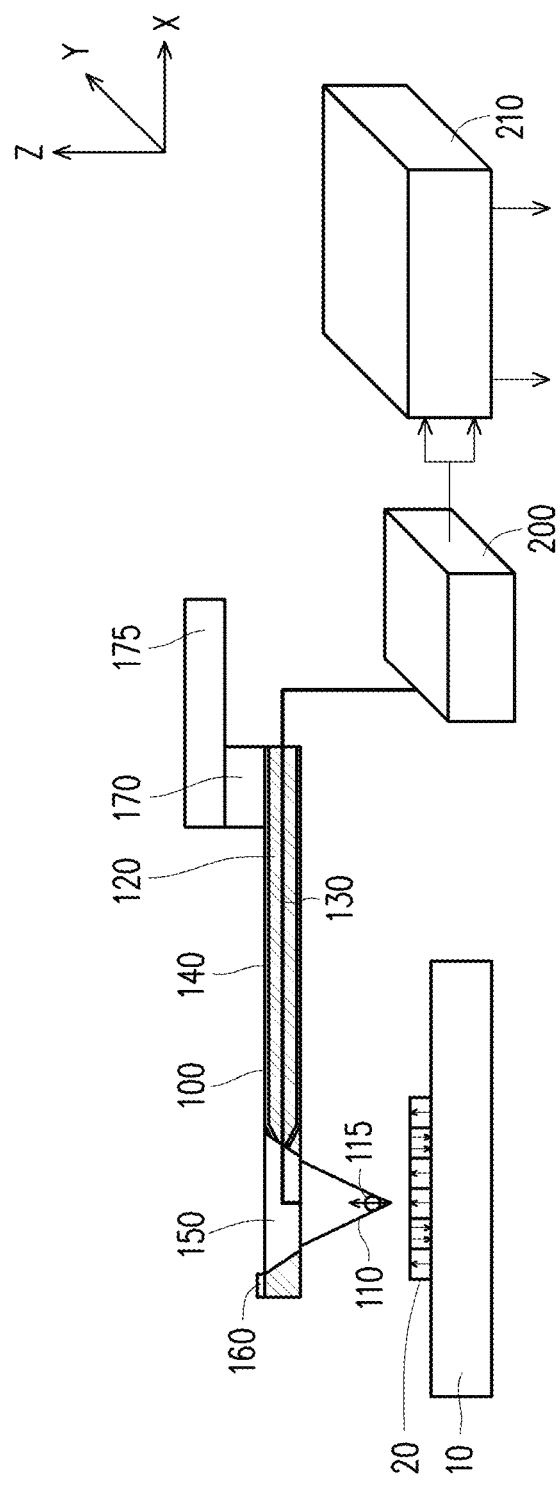
FIG. 2 shows a detailed view of a cantilever and a microwave apparatus of FIG. 1.

FIG. 2 shows a detailed view of a cantilever 100 and a microwave apparatus of FIG. 1. The cantilever 100 includes a lever body 120 having a distal end at which a diamond tip 110 is attached. The diamond tip 110 is made of a diamond having one or more nitrogen vacancy defects 115. The size of the diamond tip 110 is in a range from about 10 μm to about 100 μm in some embodiments. A nitrogen vacancy center is a naturally occurring or technically created impurity in a diamond crystal, where a nitrogen atom replaces a carbon atom creating a vacancy next to the nitrogen atom. The diamond tip 110 can include a single nitrogen vacancy defect or multiple nitrogen vacancy defects.

In some embodiments, the diamond tip 110 includes a single nitrogen vacancy defect, which can ensure a high spatial resolution and sensitivity. When multiple nitrogen vacancy defects are randomly distributed in the diamond tip 110, it may reduce spatial resolution and/or sensitivity. The nitrogen vacancy defect is located at near the apex of the diamond tip (e.g., within about 1 nm to about 10 nm from the apex of the diamond tip).

The diamond crystal can be a (111) crystal in some embodiments. The diamond tip with a nitrogen vacancy defect can detect the samples' magnetic field strength directly, quantitatively and consistently, as explained below. The magnetic moment of the nitrogen vacancy defect is fixed inside the diamond and it will not change or impact the magnetic moment of the sample being measured.

The lever body 120 is made of an insulating material, such as silicon nitride. A wire 130 for supplying microwaves is embedded in the lever body, and is coupled to the diamond tip 110. The wire 130 is made of, for example, Au, Al or Cu, or an alloy thereof, in some embodiments. Further, the lever body 120 is at least partially covered by a conductive cover 140 to form a coaxial microwave guide. The impedance of the wire 130 at the microwave frequency range is in a range from about 10Ω to about 100Ω in some embodiments. The conductive cover 140 is made of, for example, Cu, Au, or Al, or an alloy thereof, and can be a film or sheet shape or a mesh, in some embodiments. The conductive cover (shield) is impedance matched with the cantilever for efficient microwave delivery to the tip. As shown in FIG. 2, the distal end of the cantilever 100 has an opening 150 through which the excitation light passes. In some embodiments, the opening 150 has a circular shape, an oval shape or a polygonal shape. In certain embodiments, the opening 150 is filled with a transparent or translucent material to reinforce the opening portion of the cantilever 100.

In some embodiments, the thickness of the cantilever 100 is in a range from about 2 µm to about 20 µm, the width thereof is in a range from about 20 µm to about 50 um, and the length thereof is in a range from about 200 µm to 1500 µm.

The cantilever 100 can be manufactured by the following operations. First, a first body material, such as silicon nitride thin bar, is provided. A groove for the wire 130 is formed on the first body material, and the wire is embedded in the groove. Then, second body material, such as a silicon nitride thin bar, is bonded to the first body material to sandwich the wire inside. Then, the diamond tip 110 is attached to the cantilever.

The cantilever 100 can also be used as a cantilever for an atomic force microscope in some embodiments. The cantilever 100 includes a mirror 160 for use in the AFM measurement. Further, a piezo-actuator 170 supports the cantilever 100 for the AFM measurement.

The magnetic field strength measurement apparatus further includes a microwave generator 200. The microwave generator 200 provides excitation electric power to the diamond top 110. The microwave generator 200 produces a varying excitation electric power that is controlled to sweep the frequency in a continuous or stepped manner. A continuous or pulsed excitation electric power produced by the microwave generator has power in a range from about 0.5 W to about 10 W, and a frequency ranging from about 1 GHz to about 5 GHz, in some embodiments. In certain embodiments, the center frequency of the microwaves is about 2.87 GHz and is swept from about 2.70 GHz to about 3.0 GHz. Although in the present disclosure the microwaves are provided by the wire 130 to the diamond tip 110, the microwaves can be applied from an antenna placed near the diamond tip 110.

The microwave generator 200 further includes a microwave detector and an impedance adjustment circuit in some embodiments to monitor a reflective electric power from the cantilever 100 and adjust the impedance between the microwave generator 200 and the cantilever 100.

Further, a lock-in-amplifier 210 is coupled to the microwave generator 200, in some embodiments. The microwave generator 200 outputs a real part and an imaginary part of a scanning microwave impedance microscopy signal, and the lock-in-amplifier 210 can output dR/dV and dC/dV values corresponding to the real part and an imaginary part of a scanning microwave impedance microscopy signal, respectively.

A system control computer 300 (see, FIG. 1) is coupled to the stage 10, the optical detector controller 80, and the microwave generator 200 and other parts of the magnetic field strength measurement apparatus to control each part, acquire data and analyze the acquired data. The system control computer 300, the optical detector controller 80, and/or the microwave generator 200 include one or more processors (e.g., CPU), memories (RAM and/or ROM) and I/O. One of the memories stores a control program, and the control program, when executed by the processors, causes the processors to control the entire or a part of the magnetic field strength measurement apparatus.

In an AFM mode, a surface topography of the sample can be obtained. To obtain the surface topography, the reaction of the tip of the cantilever to the forces that the sample imposes on it can be used to form an image of the three-dimensional shape (topography) of a sample surface at a high resolution. This is achieved by scanning the position of the sample with respect to the tip (X-Y directions) and recording the height of the cantilever that corresponds to a constant tip-sample interaction).

More specifically, the cantilever 100 is carried by a support 175 via a piezoelectric element 170 that oscillates the cantilever 100 as shown in FIG. 2. The tip 110 having a sharp apex is fixed to the free end of the cantilever 100. The detector (not shown), for example, an optical detector, records the deflection and motion of the cantilever. The sample 20 mounted on the sample stage 10 is displaced (scanned) in x, y, and z directions with respect to the tip apex. By moving the stage in the z direction so as to maintain the force between the tip and the surface of the sample constant, it is possible to obtain the surface topography of the sample.

Figures 3A, 3B:
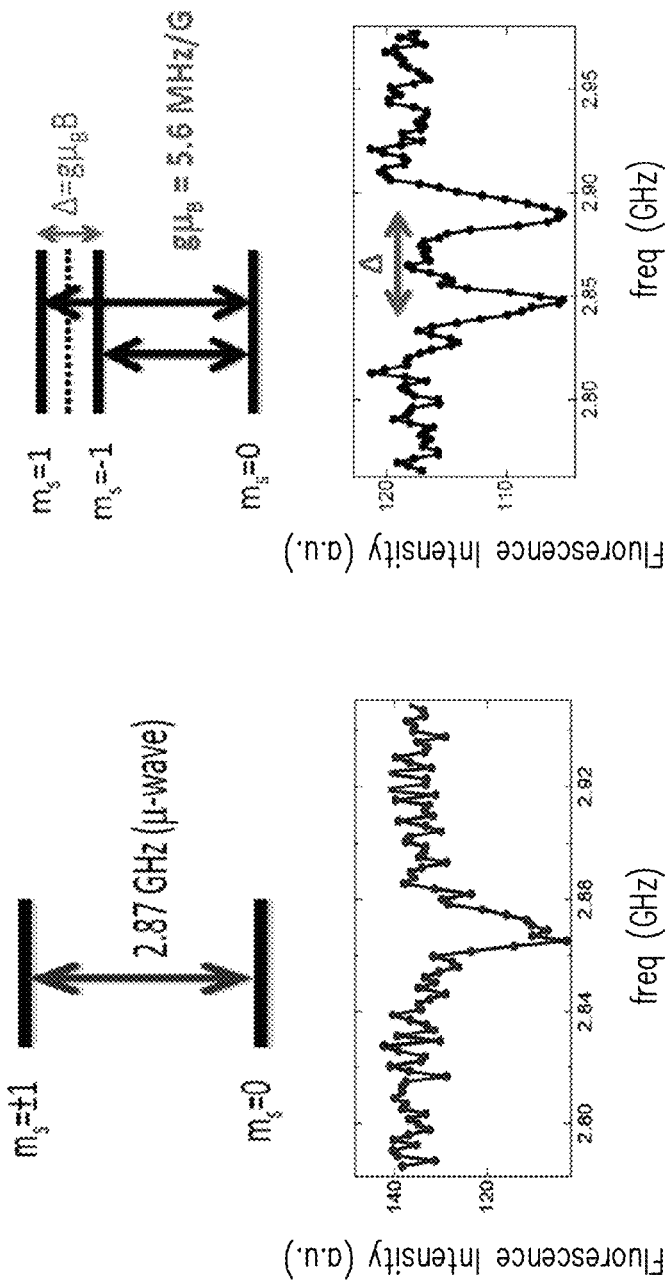
FIGS. 3A and 3B show the principle of optically detected magnetic resonance (ODMR).

FIGS. 3A and 3B show the principle of optically detected magnetic resonance (ODMR). When a nitrogen vacancy defect in the diamond crystal is optically excited by excitation light having a wavelength range from 460 nm to 580 nm, the nitrogen vacancy defect causes an intense fluorescence emission from the nitrogen vacancy defect with lifetimes in the millisecond range.

For example, when the nitrogen vacancy defect is excited with a laser at a wavelength of 532 nm, in response, a luminescence with a zero phonon line at 637 nm or 675 nm is emitted, at room temperature. The ground state of the nitrogen vacancy defect has an electron spin triplet structure with a zero-field frequency splitting of 2.87 GHz between the $m_S=0$ and the degenerate $m_S=\pm 1$ states.

As shown in FIG. 3A, in the absence of an external magnetic field strength B, when the frequency of the microwaves is swept, a fluorescence intensity dip can be observed at around 2.87 GHz frequency.

In the presence of a magnetic field strength B, the resonance peak (fluorescence intensity dip) splits due to the Zeeman effect. As shown in FIG. 3B, two resonance peaks (fluorescence intensity dips) can be identified, respectively corresponding to transitions between $m_S=0$ and $m_S=-1$, and between $m_S=0$ and $m_S=+1$ sublevels. The energy level difference $\Delta$ between $m_S=-1$ and $m_S=+1$ sublevels is given by $\Delta=g\mu_B B$, where g is a constant, $\mu_B$ is a Bohr magneton (which is $\mu_B=9.27\times 10^{-24}$ J·T$^{-1}$=o 1.4 MHz/Gauss, where 1 [J]=1.509E+27 [MHz] and 1 T=1E+4 Gauss, and B is the applied magnetic field strength. For a free electron, g=2 and for a nitrogen vacancy defect, g=4. Thus, in the present embodiment, the value of $g\mu_B$ is 5.6 MHz/Gauss. Accordingly, by measuring the difference in the two resonance peaks of the microwave frequency, the magnetic field strength B can be determined.

Thus, the magnetic field strength may be evaluated by measuring the Zeeman shifts of the nitrogen vacancy defect electron spin sub-levels through the optical detection of electron spin resonance (ESR), i.e., optically detected magnetic resonance (ODMR). The optically detected magnetic resonance can be measured by detecting a decrease in the photo luminescence caused by the electron spin resonance of the nitrogen vacancy defect while varying at least one of the excitation microwave frequencies and the magnetic field strength.

According to an embodiment of the present disclosure, a magnetic sample (e.g., a magnetic film formed on a substrate) can be measured or analyzed by using the apparatus shown in FIG. 1. First, a magnetic film, as a sample 20, is formed on a substrate. The magnetic film can be Co, CoPt, CoFe and/or CoFeB, which may be utilized in a MRAM device. The magnetic film can be formed by physical vapor deposition (PVD) including sputtering, and/or chemical vapor deposition (CVD) or any other suitable method. The magnetic film generally includes portions having different magnetized statuses causing different magnetic field strength. The magnetic sample 20 can be a magnetic film for a hard disk drive or a magnetic head.

The magnetic sample 20 is placed on a sample stage 10. By controlling the X-Y moving mechanism of the stage 10, an area to be measured is moved under the diamond tip 110 of the cantilever 100. The stage 20 can be moved with nano-meter order accuracy, for example in a range from about 1 nm to about 5 nm.

Then, the excitation light is applied to the nitrogen vacancy defect in the diamond tip 110 through the objective lens 50, while a microwave signal is applied through the wire 130 embedded in the cantilever 100. The fluorescence light caused by optical pumping at the nitrogen vacancy defect is monitored by the optical detector 70, while varying the microwave frequency between, for example, 2.70 GHz to 3.0 GHz. The system control computer 300 receives a signal corresponding to the varying microwave frequency from the microwave source 200 and a signal corresponding to the luminescence light intensity and/or the difference $\Delta$ between the two fluorescence intensity dips from the optical detector controller 80 in synchronization with each other. From these two signals, the system control computer 300 can calculate the strength of the magnetic field at the point-of-interest of the magnetic sample 20.

Further, in order to obtain a spatial (e.g., two-dimensional) distribution of the magnetic field strength, the stage 20 is moved, i.e., scanned relative to the diamond tip 110. The stage 20 can be continuously moved or moved in a step-by-step manner.

In some embodiments, before measuring the magnetic field strength, a topography first scan, in which a cantilever force is scanned in an AFM mode, is performed to obtain topography information of the sample 20. Then, the magnetic field strength measurement using ODMR is performed with maintaining the distance between the diamond tip 110 and the surface of the magnetic sample 20.

As set forth above, in a magnetic resonance force microscopy (MRFM), the magnetic force to be measured is very sensitive to the distance between the surface of the sample to be measured and the tip of the cantilever, because the force decreases proportional to $(distance)^{-4}$. In contrast, in the present embodiments, the magnetic field strength B to be measured decreases proportional to $(distance)^{-2}$. Accordingly, the measurement of the magnetic field strength B according to the aforementioned technique is much less sensitive to the distance between the surface of the sample to be measured and the tip of the cantilever, and thus it is possible to perform substantially a "topography-free" magnetic field and domain imaging. Further, since the stage 20 can be moved with nano-meter order accuracy, it is possible to obtain a distribution of the magnetic field strength B with a very high spatial resolution in a range from about 1 nm to about 10 nm in some embodiments.

The evaluation of the magnetic material film by using the apparatus as explained in FIGS. 1-3 can be performed in-line and/or off-line in the manufacturing operations. In some embodiments, when a magnetic material layer (e.g., a thin film having a thickness in a range from about 0.5 nm to about 10 nm) is formed over the underlying structures (e.g., a transistor) disposed over a substrate and is appropriately magnetized, the measurement for obtaining a magnetic field strength and its spatial distribution is performed. In other embodiments, a magnetic material layer formed as a test sample is evaluated by using the apparatus as explained with FIGS. 1-3.

It will be understood that not all advantages have been necessarily discussed herein, no particular advantage is required for all embodiments or examples, and other embodiments or examples may offer different advantages.

For example, in the present disclosure, by using a diamond tip having a single nitrogen vacancy defect, it is possible to obtain a higher spatial resolution and an improved sensitivity in an optically detected magnetic resonance measurement. Further, by using a cantilever with a built-in coaxial microwave antenna, it is possible to efficiently supply microwaves to the diamond tip and to more easily adjust impedance matching of the diamond tip and the microwaves.

In accordance with an aspect of the present disclosure, in an apparatus for measuring a magnetic field strength includes a stage on which a sample to be measured is placed, a cantilever having a tip, an optical system having a light source and a light receiver, and a microwave power source. The tip is a diamond tip having a nitrogen vacancy defect. The optical system is configured such that excitation light from the light source is focused at the diamond tip. The cantilever is configured as a coaxial microwave antenna through which microwaves from the microwave power source are supplied to the diamond tip. In one or more of the foregoing and following embodiments, the cantilever includes a cantilever body, a conductive wire embedded in the cantilever body, and a conductive cover disposed on an outer surface of the cantilever body. In one or more of the foregoing and following embodiments, the cantilever body is made of an insulating material. In one or more of the foregoing and following embodiments, the cantilever body is made of silicon nitride. In one or more of the foregoing and following embodiments, the microwave power source and the diamond tip are impedance matched. In one or more of the foregoing and following embodiments, the microwave power source is configured to generate the microwaves having a variable frequency in a range from 2.70 GHz to 3.0 GHz. In one or more of the foregoing and following embodiments, the apparatus further includes one or more controllers configured to control the stage, the light receiver and the microwave power source. In one or more of the foregoing and following embodiments, the controllers receive a signal from the light receiver synchronized with varying of a frequency of the microwaves. In one or more of the foregoing and following embodiments, the stage and the cantilever are configured to function as an atomic force microscope. In one or more of the foregoing and following embodiments, the diamond tip has a single nitrogen vacancy defect. In one or more of the foregoing and following embodiments, a peak wavelength of the excitation light is in a range from about 460 nm to about 580 nm. In one or more of the foregoing and following embodiments, the optical system includes an objective lens to focus the excitation light at the diamond tip and a numerical aperture of the objective lens is in a range from 0.85 to 0.90.

In accordance with another aspect of the present disclosure, in a method of measuring a magnetic field strength of a magnetic material thin film, a magnetic material sample is placed on a stage. A cantilever having a tip is placed over the magnetic material sample with a space therebetween. Excitation light is applied to the tip, while supplying microwaves to the tip. Fluorescent light emitted from the tip is detected. The magnetic field strength of the magnetic material thin film is obtained based on the detected fluorescent light and a frequency of the microwaves. The tip is a diamond tip having a single nitrogen vacancy defect, and the cantilever is configured as a coaxial microwave antenna and the microwaves are supplied from a microwave power source to the diamond tip via coaxial microwave antenna. In one or more of the foregoing and following embodiments, the fluorescent light is detected while changing the frequency of the microwaves in a range at least between 2.70 GHz and 3.0 GHz. In one or more of the foregoing and following embodiments, a peak wavelength of the excitation light is in a range from about 460 nm to about 580 nm. In one or more of the foregoing and following embodiments, the magnetic field strength of the magnetic material thin film is obtained by scanning the cantilever relative to the magnetic material thin film. In one or more of the foregoing and following embodiments, the cantilever is scanned relative to the magnetic material thin film by moving the stage. In one or more of the foregoing and following embodiments, a surface topography of at least a part of the magnetic material thin film is measured by using atomic force microscopy. The fluorescent light emitted from the tip is detected with a constant distance between the tip and a surface of the magnetic material thin film.

In accordance with another aspect of the present disclosure, a cantilever for an apparatus for an atomic force microscope measurement and optically detected magnetic resonance measurement is provided. The cantilever includes a cantilever body, a tip, a conductive wire embedded in the cantilever body, and a conductive cover disposed on an outer surface of the cantilever body. In one or more of the foregoing and following embodiments, the tip is a diamond tip having a single nitrogen vacancy defect.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for measuring a magnetic field strength, comprising:
    a stage on which a sample to be measured is placed;
    a cantilever having a tip;
    an optical system having a light source and a light receiver; and
    a microwave power source, wherein:
    the tip is a diamond tip having a nitrogen vacancy defect,
    the optical system is configured such that excitation light from the light source is focused at the diamond tip,
    the cantilever is configured as a coaxial microwave antenna through which microwaves from the microwave power source are supplied to the diamond tip, and
    the cantilever includes a cantilever body, a conductive wire embedded in the cantilever body, and a conductive cover disposed on an outer surface of the cantilever body, wherein the cantilever body is made of an insulating material and the conductive cover is impedance matched with the cantilever.

2. The apparatus of claim 1, wherein the cantilever body is made of silicon nitride.

3. The apparatus of claim 1, wherein the microwave power source and the diamond tip are impedance matched.

4. The apparatus of claim 1, wherein the microwave power source is configured to generate the microwaves having a variable frequency in a range from 2.70 GHz to 3.0 GHz.

5. The apparatus of claim 1, further comprising one or more controllers configured to control the stage, the light receiver and the microwave power source.

6. The apparatus of claim 5, wherein the one or more controllers receive a signal from the light receiver synchronized with varying of a frequency of the microwave.

7. The apparatus of claim 1, wherein the stage and the cantilever are configured to function as an atomic force microscope.

8. The apparatus of claim 1, wherein the diamond tip has a single nitrogen vacancy defect.

9. The apparatus of claim 1, wherein a peak wavelength of the excitation light is in a range from 460 nm to 580 nm.

10. The apparatus of claim 1, wherein the optical system includes an objective lens to focus the excitation light at the diamond tip and a numerical aperture of the objective lens is in a range from 0.85 to 0.90.

11. The apparatus of claim 1, wherein the conductive wire at a microwave frequency range includes an impedance in a range from 10Ω to 100Ω.

12. A method of measuring a magnetic field strength of a magnetic material thin film, the method comprising:
    placing a magnetic material sample on a stage;
    placing a cantilever having a tip over the magnetic material sample with a space therebetween;
    applying excitation light to the tip, while supplying microwaves to the tip;
    detecting fluorescent light emitted from the tip;
    obtaining the magnetic field strength of the magnetic material thin film based on the detected fluorescent light and a frequency of the microwaves, wherein:
    the tip is a diamond tip having a single nitrogen vacancy defect placed at near an apex of the tip less than 5 nm, and
    the cantilever is configured as a coaxial microwave antenna and the microwaves are supplied from a microwave power source to the diamond tip via coaxial microwave antenna.

13. The method of claim 12, wherein the fluorescent light is detected while changing the frequency of the microwaves in a range including at least between 2.70 GHz and 3.0 GHz.

14. The method of claim 13, wherein a peak wavelength of the excitation light is in a range from 460 nm to 580 nm.

15. The method of claim 13, wherein the magnetic field strength of the magnetic material thin film is obtained by scanning the cantilever relative to the magnetic material thin film.

16. The method of claim 15, wherein the cantilever is scanned relative to the magnetic material thin film by moving the stage.

17. The method of claim 16, further comprising measuring a surface topography of at least a part of the magnetic material thin film by using atomic force microscopy,
wherein the fluorescent light emitted from the tip is detected with a constant distance between the tip and a surface of the magnetic material thin film.

18. An apparatus for measuring a magnetic field strength, comprising:
a stage on which a sample to be measured is placed;
a cantilever having a tip disposed over the stage;
an optical system having a light source and a light receiver, and disposed over the cantilever; and
a microwave power source coupled to the cantilever, wherein:
the tip is a diamond tip having a single nitrogen vacancy defect,
the cantilever includes an opening above the diamond tip for receiving excitation light, and
the cantilever includes a cantilever body, a conductive wire embedded in the cantilever body, and a conductive cover disposed on an outer surface of the cantilever body, wherein the cantilever body is made of an insulating material and the conductive cover is impedance matched with the cantilever.

19. The apparatus of claim 18, wherein the optical system further comprises an objective lens including an immersion lens.

* * * * *